United States Patent
Kajitani et al.

(10) Patent No.: US 8,272,912 B2
(45) Date of Patent: Sep. 25, 2012

(54) ORGANIC ELECTROLUMINESCENCE DEVICE AND METHOD FOR PRODUCING THE SAME

(75) Inventors: Masaru Kajitani, Niihama (JP); Shinichi Morishima, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 176 days.

(21) Appl. No.: 12/670,599

(22) PCT Filed: Jul. 24, 2008

(86) PCT No.: PCT/JP2008/063285
§ 371 (c)(1), (2), (4) Date: Jan. 25, 2010

(87) PCT Pub. No.: WO2009/017025
PCT Pub. Date: Feb. 5, 2009

(65) Prior Publication Data
US 2010/0187986 A1  Jul. 29, 2010

(30) Foreign Application Priority Data
Jul. 31, 2007  (JP) ................. 2007-200101

(51) Int. Cl.
*H01J 9/26* (2006.01)
(52) U.S. Cl. .......................... 445/25; 427/66
(58) Field of Classification Search ............... 313/498, 313/504, 506, 509, 512; 445/25; 427/64, 427/66; 156/308.2
See application file for complete search history.

(56) References Cited

U.S. PATENT DOCUMENTS 6,864,629 B2  3/2005  Miyaguchi et al.
2003/0164677 A1  9/2003  Miyaguchi et al.
2005/0053719 A1  3/2005  Ishida
2006/0028125 A1  2/2006  Kim et al.
2007/0049155 A1  3/2007  Moro et al.
2007/0132381 A1  6/2007  Hayashi et al.
2007/0194303 A1  8/2007  Harada et al.

FOREIGN PATENT DOCUMENTS

| CN | 1979886 A | 6/2007 |
|---|---|---|
| JP | 2000-223264 A | 8/2000 |
| JP | 2005044613 A | 2/2005 |
| JP | 2005-116483 A | 4/2005 |
| JP | 2007-66775 A | 3/2007 |
| JP | 2007-157343 A | 6/2007 |
| JP | 2007-157606 A | 6/2007 |
| WO | 2006/115530 A1 | 11/2006 |

OTHER PUBLICATIONS

Japan Patent Office, "Notification of Reason for Refusal," issued in connection with Japanese Patent Application No. 2007-200101, dated Jul. 17, 2012.

*Primary Examiner* — Vip Patel
(74) *Attorney, Agent, or Firm* — Sughrue Mion, PLLC

(57) ABSTRACT

It is an object of the present invention to provide an organic EL device having a structure to enhance a barrier property against gases such as water vapor and oxygen which penetrate into an organic EL element formed on a substrate.
That is, the present invention provides the organic EL device including a substrate 10, an organic EL element 20 holding an organic EL layer including a light emitting layer between one pair of electrodes of which at least one is transparent or translucent, a sealing layer 30 which seals the organic EL element 20 and in which multiple layers are formed by stacking an inorganic film and an organic film alternately and a sealing glass substrate 40 disposed by tightly adhering onto an uppermost organic film 33-n in the sealing layer 30, on the substrate 10.

4 Claims, 3 Drawing Sheets

ORGANIC ELECTROLUMINESCENCE DEVICE AND METHOD FOR PRODUCING THE SAME

TECHNICAL FIELD

The present invention relates to an organic electroluminescence (organic EL) and a method for producing the same.

BACKGROUND ART

An organic electroluminescence element (organic EL element) has a structure in which an organic electroluminescence layer (organic EL layer) including a light emitting layer made from an organic light emitting material is held between one pair of electrodes of which at least one is transparent or translucent. When a voltage is applied to between the one pair of the electrodes of the organic EL element having such a structure, electrons are injected from a cathode into the light emitting layer, holes are injected from an anode into the light emitting later and they are recombinated in the light emitting layer. Thus, the light emitting material in the light emitting layer is excited by energy generated at that time, and emits the light in the light emitting layer. A device obtained by forming this organic EL element on a substrate is referred to as an organic EL device herein. The organic EL device in which the organic EL elements have been formed on a platy substrate could be used for, for example, a planar light source, a segment display device, a dot matrix display device or the like.

When the organic EL element is exposed to water vapor or oxygen, it is deteriorated. Thus, after forming the organic EL element by sequentially stacking the anode, the organic EL layer including the light emitting layer and the cathode on the substrate such as a glass substrate, the organic EL element is entirely covered with an inorganic passivation film composed of silicon nitride and further a resin sealing film composed of resin on a surface of the inorganic passivation film (e.g., see Patent Document 1). In this case, if the inorganic passivation film has no defect, only by covering with the inorganic passivation film alone, high barrier property against the above gases can be sufficiently obtained. However, it is likely that the defect such as pinholes are found in the inorganic passivation films which are usually made. For this reason, a permeation path of gases such as water vapor and oxygen is blocked to enhance the entire barrier property by forming the resin sealing film on an upper surface of the inorganic passivation film to cover the defect of the inorganic passivation film, thereby preventing the deterioration of the organic EL element.

Patent Document 1: JP 2000-223264 A

DISCLOSURE OF INVENTION

Problem to be Solved by the Invention

However, the resin sealing film is exposed to atmosphere in the organic EL device having the sealing structure in which the inorganic passivation film and the resin sealing film have been stacked, described in the above Patent Document 1. Thus, this causes a problem that this resin sealing layer is largely deteriorated, the gas such as water vapor and oxygen gradually penetrates from the resin sealing layer, and this gas is diffused through an interface between the resin sealing layer and the inorganic passivation film and the defect of the inorganic passivation film and reaches the organic EL element. In particular, since an area of the resin sealing layer in contact with ambient air is large, the penetration of the gas from portions covered with the resin sealing layer could not be prevented sufficiently.

The present invention has been made in the light of the above, and it is an object of the present invention to provide an organic EL device that has a structure to enhance a barrier property against the gases such as water vapor and oxygen which penetrate into the organic EL element formed on a substrate, and a method for producing the same.

Means for Solving Problem

In order to accomplish the above object, the organic EL device according to the present invention comprises: a substrate; an organic electroluminescence element that is provided on the substrate and holds an organic electroluminescence layer (organic EL layer) including a light emitting layer between one pair of electrodes of which at least one is transparent or translucent; a sealing layer that is composed of an inorganic film and an organic film alternately stacked, and seals the organic electroluminescence element; and a sealing glass substrate that is arranged on an uppermost organic film among the organic layer(s) constituting the sealing layer, and adheres to the uppermost organic film configured to entirely cover an upper surface of the uppermost organic film.

The present invention provides the following.

[1] An organic electroluminescence device comprising:
   a substrate;
   an organic electroluminescence element that is provided on the substrate and holds an organic electroluminescence layer including a light emitting layer between one pair of electrodes of which at least one is transparent or translucent;
   a sealing layer that includes an inorganic film and an organic film alternately stacked, and seals the organic electroluminescence element; and
   a sealing glass substrate that is arranged on an uppermost organic film in the components of the sealing layer, and adheres to the uppermost organic film configured to entirely cover an upper surface of the uppermost organic film.

[2] The organic electroluminescence device according to the [1], wherein the sealing layer comprises multiple layers constituted by alternately stacking the inorganic film and the organic film.

[3] The organic electroluminescence device according to the [1] or [2], wherein said organic film is a film obtained by polymerizing a (meth)acrylic compound.

[4] A method for producing an organic electroluminescence device comprising the steps of: forming an organic electroluminescence element that holds an organic electroluminescence layer including a light emitting layer between one pair of electrodes of which at least one is transparent or translucent on a substrate; forming a transparent first inorganic film on the organic electroluminescence element; applying a polymerizable monomer on the first inorganic film; and allowing a sealing glass substrate to adhere by putting the sealing glass substrate on a side to which said polymerizable monomer on said substrate has been applied and curing the monomer by energy ray or heat.

[5] The method for producing the organic electroluminescence device according to the [4] further comprising: forming a transparent first organic film by applying the polymerizable monomer on the first inorganic film and curing the monomer by the energy ray or the heat, after the step of forming the first inorganic film and before the step of applying the polymerizable monomer; and forming a transparent second inorganic film on said first organic film.

[6] The method for producing the organic electroluminescence device according to the [5], wherein the step of forming the first inorganic film and the step of forming the first organic film are repeated a certain number of times to form multiple layers of an inorganic/organic stacked body composed of the inorganic film and the organic film.

[7] The method for producing the organic electroluminescence device according to any one of the [4] to [6], wherein the polymerizable monomer is partially polymerized by the energy ray or the heat in the step of attaching the polymerizable monomer.

[8] The method for producing the organic electroluminescence device according to the [4], wherein the polymerizable monomer is a monomer of a (meth)acrylic compound.

EFFECT OF THE INVENTION

According to the present invention, since not only the sealing layer composed of a multilayer structure including an inorganic film and an organic film but also the sealing glass substrate on the uppermost organic film in the sealing layer are arranged, the upper surface of the uppermost organic film is out of contact with the ambient air and the penetration of the ambient air therefrom can be prevented. Therefore, the present invention has the effect that the organic EL device having the higher barrier property against the gases such as water vapor and oxygen compared with the conventional organic EL devices can be obtained.

BRIEF DESCRIPTION OF DRAWINGS

FIG. 2-1 is a cross-sectional view schematically depicting an example of a method for producing an organic EL device according to an embodiment of the present invention (No. 1);

FIG. 2-2 is a cross-sectional view schematically depicting an example of the method for producing the organic EL device according to the embodiment of the present invention (No. 2);

FIG. 2-3 is a cross-sectional view schematically depicting an example of the method for producing the organic EL device according to the embodiment of the present invention (No. 3);

FIG. 2-4 is a cross-sectional view schematically depicting an example of the method for producing the organic EL device according to the embodiment of the present invention (No. 4);

FIG. 2-5 is a cross-sectional view schematically depicting an example of the method for producing the organic EL device according to the embodiment of the present invention (No. 5);

FIG. 2-6 is a cross-sectional view schematically depicting an example of the method for producing the organic EL device according to the embodiment of the present invention (No. 6); and FIG. 2-7 is a cross-sectional view schematically depicting an example of the method for producing the organic EL device according to the embodiment of the present invention (No. 7).

EXPLANATIONS OF LETTERS OR NUMERALS

Figure 1:
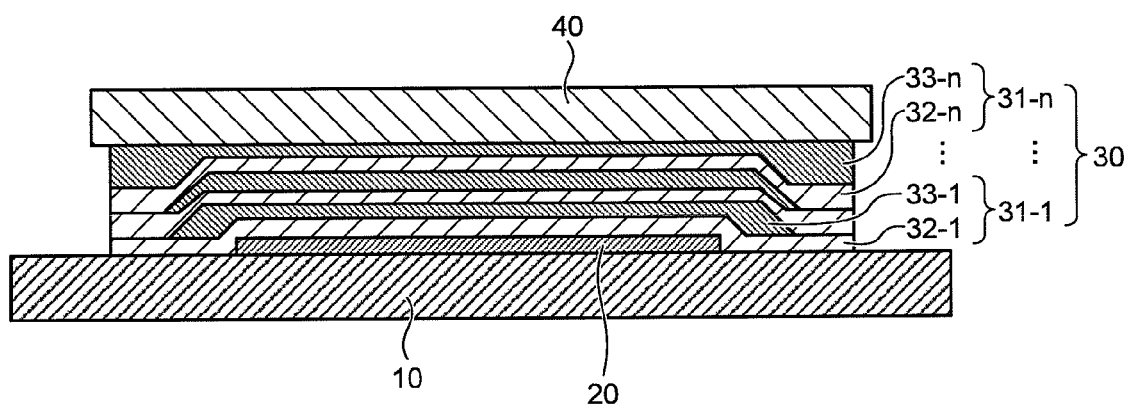
FIG. 1 is a cross-sectional view schematically depicting an example of a structure of an organic EL device according to an embodiment of the present invention.

10 Substrate
20 Organic EL element
30 Sealing layer
31-1 to 31-n Inorganic/organic stacked bodies
32-1 to 32-n Inorganic films
33-1 Organic film
33-n Uppermost organic film
34-1 to 34-n Organic monomers
40 Sealing glass substrate

BEST MODES FOR CARRYING OUT THE INVENTION

Embodiments of the present invention will be described in more detail below with reference to the drawings. For easy understanding, a scale of each member in the drawing is different from an actual one in some cases. The present invention is not limited by the following description and can be appropriately changed in the scope which does not depart from the gist of the present invention. The members such as lead wires are also present in the organic EL device, but they are not required directly for the description of the present invention, and thus their description is omitted. For convenience of describing a layer structure, examples shown below will be described together with figures in which a substrate is disposed at a bottom, but the organic EL device of the present invention is not necessarily limited to this form in which the organic EL device of the present invention is produced and used in this vertical and horizontal disposition, and may be appropriately conditioned in its disposition.

FIG. 1 is a cross-sectional view schematically depicting an example of the structure of the organic EL device according to the embodiment of the present invention. The organic EL device in FIG. 1 is a top emission type organic EL device in which light is extracted through a side opposed to the substrate 10 on which an organic EL element 20 has been formed, and the device has the structure in which the organic EL element 20 in which an anode, an organic EL layer including a light emitting layer and a cathode are stacked in this order, a sealing layer 30 composed of laminated bodies of inorganic films and organic films which cover the entire organic EL element 20 and a sealing glass substrate 40 provided on the sealing layer 30 are formed sequentially on the substrate 10.

Here as the substrate 10, various materials such as glass substrates, silicon substrates and plastic substrates can be used. As the anode, electrically conductive metal oxide films and translucent metal thin films, and electrically conductive organic films which have a relatively large work function (it is suitable to have the work function of more than 4.0 eV) are generally used. Specifically, usable examples may include: transparent conductive films made from the metal oxide such as indium tin oxide (referred to as ITO) and tin oxide; metals such as gold (Au), platinum (Pt), silver (Ag) and copper (Cu) or alloys containing at least one among them; and organic compounds such as polyaniline or derivatives thereof and polythiophene or derivative thereof. The anode may also be formed by a layer constitution of two or more layers if necessary. A film thickness of the anode may be appropriately selected in consideration of electric conductivity (also transmittance of the light in the case of a bottom emission type), and is, for example, 10 nm to 10 µm, preferably 20 nm to 1 µm and more preferably 50 nm to 500 nm. A method for producing the anode may include a vacuum deposition method, a sputtering method, an ion plating method and a plating method. In the case of the top emission type, a reflection film for reflecting the light emitted to the side of the substrate 10 may be provided under the anode.

The organic EL layer is constituted by including the light emitting layer composed of at least an organic substance. This light emitting layer has an organic substance (low molecular compound or macromolecular compound) which emits fluorescence or phosphorescence. This may further contain a dopant material. Examples of the organic substance may include light emitting materials such as dye materials, metal complex materials and polymer materials. The dopant materials are those doped in the organic substance if necessary for the purpose of enhancing a luminescence efficiency and changing a luminescence wavelength in the organic substance. The thickness of the light emitting layer composed of these organic substances and the dopant doped if necessary is typically 20 to 2,000 angstroms.

(Dye Materials)

Examples of the dye materials may include cyclopendamine derivatives, tetraphenylbutadiene derivatives, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, trifumanylamine derivatives, oxadiazole dimers and pyrazoline dimers.

(Metal Complex-Based Materials)

Examples of the metal complex materials may include metal complexes having the luminescence from a triplet excitation state, such as iridium complexes and platinum complexes; metal complexes such as aluminum quinolinol complexes, benzoquinolinol beryllium complexes, benzoxazolyl zinc complexes, benzothiazole zinc complexes, azomethyl zinc complexes, porphyrin zinc complexes, and europium complexes; and in addition, metal complexes having aluminium (Al), zinc (Zn), beryllium (Be) or a rare earth metal such as terbium (Tb), europium (Eu) or dysprosium (Dy) as a center metal and having an oxadiazole, thiadiazole, phenylpyridine, phenylbenzimidazole or quinoline structure as a ligand.

(Polymer-Based Materials)

The polymer-based materials may include polyparaphenylene vinylene derivatives, polythiophene derivatives, polyparaphenylene derivatives, polysilane derivatives, polyacetylene derivatives, polyfluorene derivatives, polyvinylcarbazole derivatives, and those obtained by polymerizing the above dye materials or the metal complex materials.

Among the above light emitting materials, examples of the materials which emit blue light may include distyrylarylene derivatives, oxadiazole derivatives, and polymers thereof, polyvinylcarbazole derivatives, polyparaphenylene derivatives and polyfluorene derivatives. Among them, the polyvinylcarbazole derivatives, the polyparaphenylene derivatives and the polyfluorene derivatives, which are the polymer materials, are preferable.

Examples of the materials which emit green light may include quinacridone derivatives, coumarin derivatives and polymers thereof, polyparaphenylene vinylene derivatives and polyfluorene derivatives. Among them, the polyparaphenylene vinylene derivatives and the polyfluorene derivatives which are the polymer-based materials are preferable.

The materials which emit red light may include coumarin derivatives, thiophene derivatives and polymers thereof, polyparaphenylene vinylene derivatives, polythiophene derivatives and polyfluorene derivatives. Among them, the polyparaphenylene vinylene derivatives, the polythiophene derivatives and the polyfluorene derivatives, which are the polymer materials, are preferable.

(Dopant Materials)

Examples of the dopant materials may include perylene derivatives, coumarin derivatives, rubrene derivatives, quinacridone derivatives, squarium derivatives, porphyrin derivatives, styryl-based dyes, tetracene derivatives, pyrazolone derivatives, decacyclene and phenoxazone.

In the organic EL layer, a layer may be appropriately provided between the light emitting layer and the anode and a layer may be appropriately provided between the light emitting layer and the cathode, in addition to the light emitting layer. First, the layer provided between the light emitting layer and the anode may include: a hole injection layer, which improves hole injection efficiency from the anode; and a hole transport layer, which improves hole injection from the anode, the hole injection layer or the hole transport layer closer to the anode to the light emitting layer. The layer provided between the light emitting layer and the cathode may include: an electron injection layer, which improves hole injection efficiency from the cathode; and an electron transport layer having a function to improve the electron injection from the cathode, the electron injection layer or the electron transport layer closer to the cathode.

(Hole Injection Layer)

Materials to form the hole injection layer may include phenylamine compounds, starburst type amine compounds, phthalocyanine compounds, oxides such as vanadium oxide, molybdenum oxide, ruthenium oxide and aluminium oxide, amorphous carbon, polyaniline and polythiophene derivatives.

(Hole Transport Layer)

Examples of the materials which composes the hole transport layer may include polyvinylcarbazole or derivatives thereof, polysilane or derivatives thereof, polysiloxane derivatives having aromatic amine in their side chain or main chain, pyrazoline derivatives, arylamine derivatives, stilbene derivatives, triphenyldiamine derivatives, polyaniline or derivatives thereof, polythiophene or derivative thereof, polyarylamine or derivative thereof, polypyrrole or derivative thereof, poly(p-phenylene-vinylene) or derivative thereof, or poly(2,5-thienylene-vinylene) or derivative thereof.

When the hole injection layer or the hole transport layer has the function to block transport of the electron, these hole transport layer and the hole injection layer are also referred to as an electron blocking layer in some cases.

(Electron Transport Layer)

As the material which constitutes the electron transport layer, those known publicly can be used, and examples may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes with 8-hydroxyquinoline or derivatives thereof, polyquinoline or derivatives thereof, polyquinoxaline or derivatives thereof, or polyfluorene or derivatives thereof.

(Electron Injection Layer)

According to the type of the light emitting layer, the following the electron injection layer, for example, may be provided: an electron injection layer having a monolayer structure of a calcium (Ca) layer; or an electron injection layer having a stacked structure that is composed of the Ca layer and the layer formed from one or two or more metals belonging to any of Group IA and Group IIA in the periodic table other than Ca and having the work function of 1.5 to 3.0 eV, oxides, halides and carbonates thereof and the Ca layer. Examples of the metals having the work function of 1.5 to 3.0 eV and belonging to Group IA in the periodic table, oxides, halides and carbonates thereof may include lithium (Li), lithium fluoride, sodium oxide, lithium oxide and lithium carbonate. Examples of the metals having the work function of 1.5 to 3.0 eV and belonging to Group IIA in the periodic table other than Ca, and oxides, halides and carbonates thereof may include strontium (Sr), magnesium oxide, magnesium fluoride, strontium fluoride, barium fluoride, strontium oxide and magnesium carbonate.

When the electron transport layer or the electron injection layer has the function to block the transport of the hole, these electron transport layer and electron injection layer are also referred to as an electron blocking layer in some cases.

As the cathode, the transparent or translucent material having the relatively small work function (it is suitable to have the work function of less than 4.0 eV) and giving the easy electron injection to the light emitting layer is preferable. Usable examples may include: a metal such as lithium (Li), sodium (Na), potassium (K), rubidium (Rb), cesium (Cs), beryllium (Be), magnesium (Mg), calcium (Ca), strontium (Sr), barium (Ba), aluminium (Al), scandium (Sc), vanadium (V), Zn, yttrium (Y), indium (In), cerium (Ce), samarium (Sm), Eu, Tb and ytterbium (Yb); an alloy of two or more of the above metals; an alloy composed of one or two or more among the above metals and alloys with one or two or more among Au, Ag, Pt, Cu, manganese (Mn), titanium (Ti), cobalt (Co), nickel (Ni), tungsten (W) and tin (Sn); or graphite or a graphite intercalational compound; or metal oxide such as ITO and tin oxide.

The cathode may employ a stacked structure of two or more layers. Examples thereof may include the stacked structure composed of the above metals, metal oxide and fluoride and the alloys thereof with metals such as Al, Ag and chromium (Cr). The film thickness of the cathode may be appropriately selected in consideration of electric conductivity and durability, and is, for example, 10 nm to 10 μm, preferably 20 nm to 1 μm and more preferably 50 nm to 500 nm. Usable methods for making the cathode may include a vacuum deposition method, a sputtering method and a laminate method in which metal thin films are thermally bonded with pressure.

These layers provided between the light emitting layer and the anode and between the light emitting layer and the cathode may be appropriately selected depending on the performance required for the organic EL device to be produced. Examples of the structure of the organic EL element 20 used in the present invention may include the following layer structures (a) to (o):

(a) anode/hole transport layer/light-emitting layer/cathode
(b) anode/light-emitting layer/electron transport layer/cathode
(c) anode/hole transport layer/light-emitting layer/electron transport layer/cathode
(d) anode/hole injection layer/light-emitting layer/cathode
(e) anode/light-emitting layer/electron injection layer/cathode
(f) anode/hole injection layer/light-emitting layer/electron injection layer/cathode
(g) anode/hole injection layer/hole transport layer/light-emitting layer/cathode
(h) anode/hole transport layer/light-emitting layer/electron injection layer/cathode
(i) anode/hole injection layer/hole transport layer/light-emitting layer/electron injection layer/cathode
(j) anode/hole injection layer/light-emitting layer/electron transport layer/cathode
(k) anode/light-emitting layer/electron transport layer/electron injection layer/cathode
(l) anode/hole injection layer/light-emitting layer/electron transport layer/electron injection layer/cathode
(m) anode/hole injection layer/hole transport layer/light-emitting layer/electron transport layer/cathode
(n) anode/hole transport layer/light-emitting layer/electron transport layer/electron injection layer/cathode
(o) anode/hole injection layer/hole transport layer/light-emitting layer/electron transport layer/electron injection layer/cathode (symbol "/" indicates that the layers are adjacent to each other and stacked. The same applies below.)

Each of the above layers can be provided on the substrate in the present invention, and the sealing layer may be provided on the side opposed to the substrate with holding the respective layers therebetween. The organic EL element having the substrate and the layer structure typically has the substrate at the side of the anode, but is not limited thereto in the present invention, and may have the substrate at either side of the anode or the cathode.

Commonly, whole layer(s) provided on either side of the light emitting layer are transparent to release light from the light emitting layer in the organic EL element of the present invention. Specifically for example, when the organic EL element has the constitution of a substrate/anode/charge injection layer/hole transport layer/light emitting layer/electron transport layer/charge injection layer/cathode/sealing member, all of the substrate, the anode, the charge injection layer and the hole transport layer are made transparent to make a so-called bottom emission type element; or all of the electron transport layer, the charge injection layer, the cathode and the sealing member are made transparent to make a so-called top emission type element. When the organic EL element has the constitution of a substrate/cathode/charge injection layer/electron transport layer/light emitting layer/hole transport layer/charge injection layer/anode/sealing member, all of the substrate, the cathode, the charge injection layer and electron transport layer are made transparent to make the so-called bottom emission type element; or all of the hole transport layer, the charge injection layer, the anode and the sealing member are made transparent to make the so-called top emission type element.

The organic EL element of the present invention may further have the substrate, and each of the above layers may be provided on the substrate. The organic EL element of the present invention may further have a member for sealing on the side opposed to the substrate with holding the above respective layers therebetween. The organic EL element having the substrate and the layer constitution generally has the substrate at the side of the anode, but is not limited thereto in the present invention, and may have the substrate at either side of the anode or the cathode.

The sealing layer 30 is a layer having the high barrier property against gases such as water vapor and oxygen for the purpose of preventing the gases from being in contact with the organic EL element, and is provided for sealing the organic EL element. This sealing layer 30 is a layer composed of inorganic film(s) and organic film(s) alternately stacked. That is, this has a structure formed by stacking the inorganic film and the organic film one by one, or has a structure in which the inorganic films 32-1 to 32-n and the organic films 33-1 to 33-n are alternately provided from the bottom (side of organic EL element) to form inorganic/organic stacked bodies 31-1 to 31-n repeatedly, at least two times or more.

The inorganic films 32-1 to 32-n in the inorganic/organic stacked bodies 31-1 to 31-n are the films provided for preventing the organic EL element 20 from being exposed to the gases such as water vapor and oxygen present in the environment in which the organic EL device is placed, and is desirably to be the continuous and dense film with less defect such as pinholes. Examples of these inorganic films 32-1 to 32-n may include single films such as SiN films, SiO films, SiON films, $Al_2O_3$ films and AlN films, and stacked films thereof.

The organic films 33-1 to 33-n in the inorganic/organic stacked bodies 31-1 to 31-n are provided for filling the defect such as pinholes formed on the inorganic films 32-1 to 32-n. It is preferable that these organic films 33-1 to 33-n are formed in a narrower region than a region in which the inorganic films 32-1 to 32-n are formed. This is because if the organic films 33-1 to 33-n are formed equally to or more widely than the inorganic films 32-1 to 32-n, the exposed regions of the organic films 33-1 to 33-n are likely deteriorated. In this regard, however, the organic film 33-n formed in the uppermost layer (hereinafter referred to as an uppermost organic film) (means the uppermost layer based on the organic EL element) in the entire sealing layer 30 is preferably formed in nearly the same region as the region in which the inorganic film 32-n is formed. Those may be formed so that an upper surface of the sealing layer 30 is flattened. As these organic films 33-1 to 33-n, those obtained by polymerizing a polymerizable monomer having a good cohesive performance and an adhesive function to the inorganic films 32-1 to 32-n described above may be used. As this polymerizable monomer, an organic monomer is preferable, in particular, the organic monomer having a (meth)acryl group, i.e., (meth)acrylic compounds are suitably used. When the (meth)acrylic compounds are used as the organic monomer, an acrylic polymer obtained by polymerizing this becomes the organic film. The (meth)acrylic compounds are not particularly limited, and those having one or more (meth)acryl groups in their molecule are preferable. When one (meth)acrylic group is contained, a higher cohesive property with the inorganic films 32-1 to 32-n can be obtained. When two or three (meth)acryl groups are contained, a film strength of the organic films 33-1 to 33-n can be enhanced by increasing a crosslinking density. Compounds having a high transparency such as methyl methacrylate are suitably used for the top emission type organic EL device. The (meth)acryl group refers to an acryl group and a methacryl group.

Specific examples of such (meth)acrylic compounds may include monofunctional (meth)acrylate and difunctional or more (meth)acrylic compounds, which are not particularly limited. Examples thereof may include: compounds having a hydroxyl group such as 2-hydroxyethyl (meth)acrylate, 2-hydroxypropyl (meth)acrylate and 2-hydroxybutyl (meth)acrylate, compounds having an amino group such as dimethylaminoethyl (meth)acrylate and diethylaminoethyl (meth)acrylate, compounds having a carboxyl group such as (meth)acrylic acid, 2-(meth)acryloyloxyethyl succinate and 2-(meth)acryloyloxyethyl hexahydrophthalate; (meth)acrylate having a cyclic skeleton such as glycidyl (meth)acrylate, tetrahydrofuryl (meth)acrylate, cyclohexyl (meth)acrylate, phenoxyethyl (meth)acrylate and isobonyl (meth)acrylate; acrylic monofunctional compounds such as isoamyl (meth)acrylate, lauryl (meth)acrylate, stearyl (meth)acrylate, butoxyethyl (meth)acrylate, ethoxydiethylene glycol (meth)acrylate, methoxytriethylene glycol (meth)acrylate and methoxydipropylene glycol (meth)acrylate; acrylic difunctional compounds such as diethylene glycol di(meth)acrylate, 1,4-butanediol di(meth)acrylate, 1,6-hexanediol di(meth)acrylate, 1,9-nonanediol di(meth)acrylate, triethylene di(meth)acrylate, PEG#200 di(meth)acrylate, PEG#400 di(meth)acrylate, PEG#600 di(meth)acrylate, neopentyl di(meth)acrylate and dimethyloltricyclodecane di(meth)acrylate; and difunctional (meth)acrylic compounds such as difunctional epoxy (meth)acrylate and difunctional urethane (meth)acrylate. Usable examples of compounds having three or more (meth)acryl groups may include: (meth)acrylic multifunctional monomers such as dipentaerythritol hexa(meth)acrylate, pentaerythritol tri(meth)acrylate, pentaerythritol tetra(meth)acrylate, trimethylolpropane tri(meth)acrylate and trimethylolpropane tetra(meth)acrylate; (meth)acrylic multifunctional epoxy (meth)acrylate and (meth)acrylic multifunctional urethane (meth)acrylate. Here (meth)acrylate means acrylate or methacrylate.

Generally, when one inorganic/organic stacked body is counted as one set, it is desirable that the sealing layer 30 has about one to five sets thereof in the sealing layer 30. Because even if the sealing layer 30 has 6 sets or more of the inorganic/organic stacked bodies, a sealing effect on the organic EL element 20 is the almost same as in the case of five sets. It is desirable that the thickness of the inorganic film is about 50 nm to 1 µm and the thickness of the organic film is about 1 to 3 µm. The sealing glass substrate 40 is typically formed so as to entirely cover the upper surface of the uppermost organic film 33-n in the sealing layer 30 and tightly adhere thereto. This sealing glass substrate 40 is preferably a transparent glass substrate for visual light. The thickness thereof is desirably 0.3 mm or more. The glass substrate has the high barrier property against the gas. Thus, by providing such a sealing glass substrate in an upper layer of the sealing layer 30, it is possible to inhibit the deterioration which proceeds due to the gas bringing into contact with the surface of the uppermost organic film 33-n, and enhance the barrier property of the organic EL device.

Figures 1, 2:
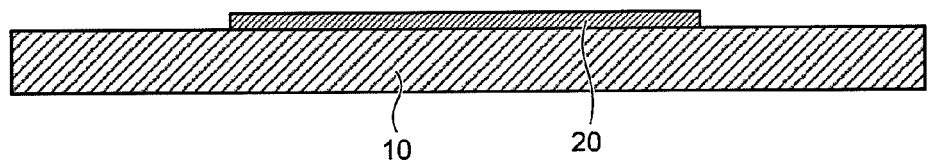
Figure 2:
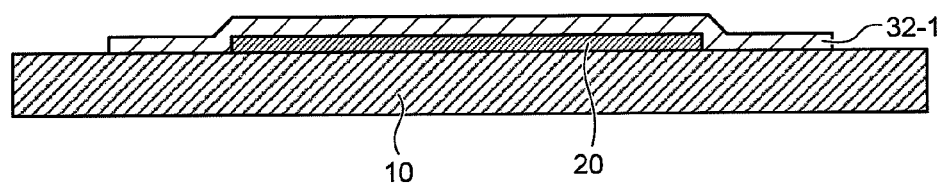

Subsequently, the method for producing the organic EL device having such a constitution will be described with reference to FIGS. 2-1 to 2-7. FIGS. 2-1 to 2-7 are cross-sectional views schematically depicting an example of the method for producing the organic EL device according to the embodiment of the present invention. First, an organic EL element constituted by holding an organic EL layer including a light emitting layer between one pair of electrodes of which at least one is transparent or translucent is formed on a substrate (step of forming organic EL element). For example, the organic EL element 20 is formed by forming an anode patterned into a predetermined shape, the organic EL layer including the light emitting layer and a cathode sequentially on the substrate 10 such as a glass substrate according to a method known conventionally and publicly (FIG. 2-1). At that time, for example, when the organic EL device is used as a dot matrix display device, a bank which is not shown in the figure is formed in order to section a light emitting region into matrix shapes, and the organic EL layer including the light emitting layer is formed in the region surrounded by this bank.

Figures 2, 3:
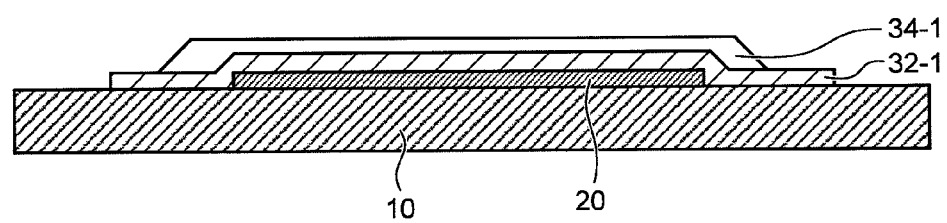
Figures 2, 3, 4:
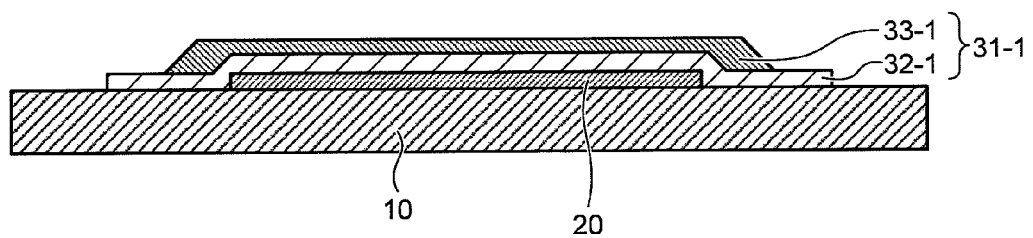
Figures 2, 3, 4, 5:
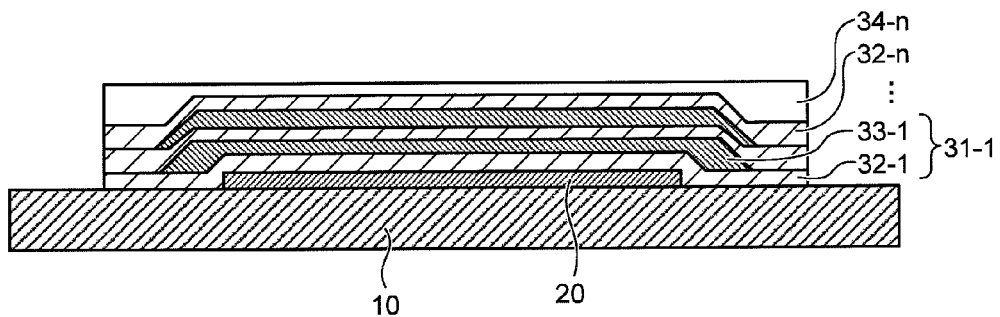
Figures 2, 3, 4, 5, 6:
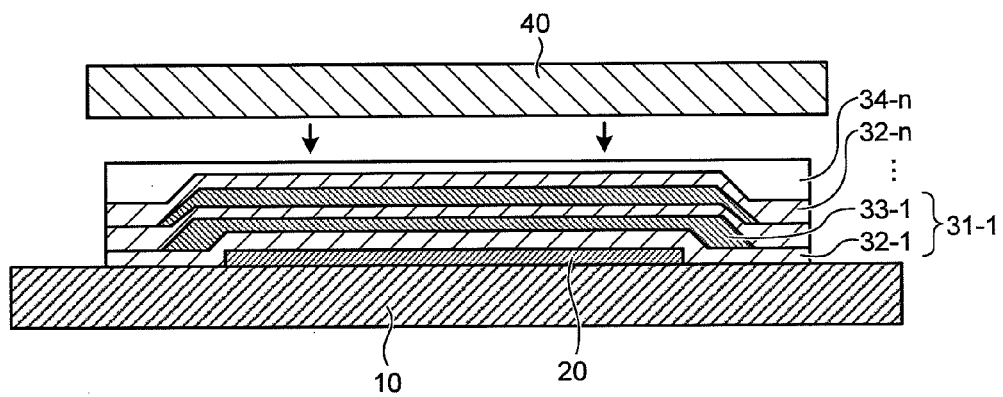
Figures 2, 3, 4, 5, 6, 7:
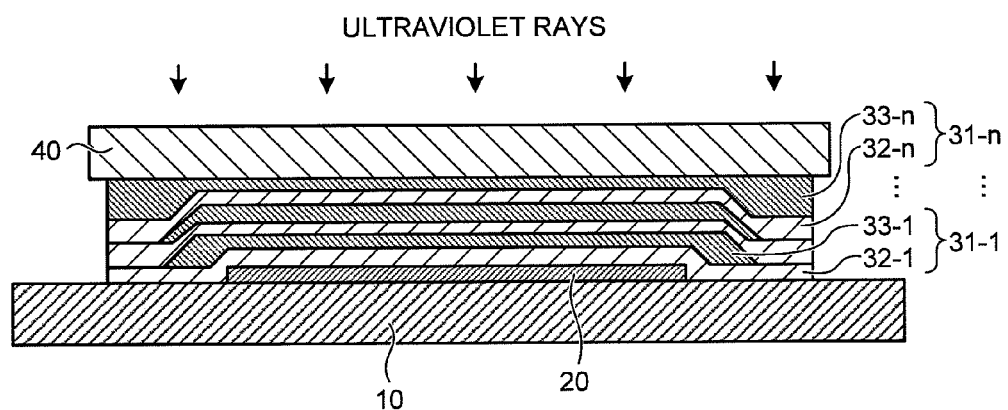

Then, a transparent first inorganic film is formed on the organic EL element (step of forming first organic film). For example, the first inorganic film 32-1 having a predetermined thickness is formed by a film forming method such as a PVD (physical vapor deposition) method such as a sputtering method or a CVD (chemical vapor deposition) method such as a plasma CVD method on the substrate 10 on which the organic EL element 20 has been formed through the step of forming the organic EL element (FIG. 2-2). Here, when the sealing layer including one set of the inorganic/organic stacked body is formed, a step of attaching a polymerizable monomer described later is carried out after completing the step of forming the first inorganic film. Meanwhile, when the sealing layer including two or more sets of the inorganic/organic stacked bodies is formed, the polymerizable monomer is applied on the first inorganic film and cured by the energy ray or the heating to form a transparent first organic film (step of forming first organic film) between the step of forming the first inorganic film and the step of attaching the polymerizable monomer. For example, an organic monomer 34-1 (preferably the monomer of a (meth)acrylic compound) as a preferable example of the polymerizable monomer is applied using a publicly known coating film forming method such as a solution coating method or a spray coating method, or a flash deposition method on the first inorganic film 32-1 formed through the step of forming the first inorganic film (FIG. 2-3). At that time, it is preferable to apply the organic monomer so that the region in which the first organic film 33-1 is formed in the latter step is smaller than the region in which the inorganic film 32-1 is formed. The applied polymerizable monomer can be crosslinked and cured by being irradiated with the energy ray such as ultraviolet ray, electron beam or plasma or by being heated, thereby forming the first organic film 33-1 (FIG. 2-4). One set of the inorganic/organic stacked body is formed by the above steps shown in FIGS. 2-2 to 2-4.

In the formation of the second set or later sets of the inorganic/organic stacked bodies, the steps of forming the inorganic/organic stacked body depicted in FIGS. 2-2 to 2-4 are repeated n−1 times, which is the number of times by subtracting one from the final set number: (n), and subsequently the step of forming the first inorganic film and the step of applying the polymerizable monomer are carried out. In other words, in order to form the final set (here the $n^{th}$ set, n is a natural number of 2 or more), i.e., the uppermost inorganic/organic stacked body 31-n, the step of applying the polymerizable monomer is carried out after carrying out the step of FIG. 2-2. The step of applying the polymerizable monomer is the step of applying the polymerizable monomer on the first inorganic film, and the uppermost organic film is formed by such a step. For example, an organic substance 34-n is applied on the upper surface of the $n^{th}$ inorganic film 32-n by the coating method or the flash deposition method so that the upper surface is flattened (FIG. 2-5).

Then, the sealing glass substrate is put on the side to which the polymerizable monomer has been applied on the substrate, and the monomer is cured by the energy ray or the heating (step of adhesion of sealing glass substrate). For example, the sealing glass substrate 40 is positioned to and put on the face to which the organic substance 34-n has been applied on the substrate 10 (FIG. 2-6). Subsequently, the organic substance 34-n present between the uppermost inorganic film 32-n and the sealing glass substrate 40 is crosslinked and polymerized by irradiation with the energy ray or the heating from the side of the sealing glass substrate 40 (FIG. 2-7). In this way, the uppermost organic film 33-n is cured as well as the uppermost organic film 33-n adheres to the sealing glass substrate 40. Then, the method for producing the organic EL device has been completed.

It is preferable to partially polymerize the polymerizable monomer by the energy ray or the heating in the step of applying the polymerizable monomer. Partially polymerizing the polymerizable monomer by the energy ray or the heating means that a portion of the polymerizable monomer is irradiated with the energy ray or heated. For example, in FIG. 2-5, the organic substance 34-n may be applied on the $n^{th}$ inorganic film 32-n, partially irradiated with the energy ray to be polymerized, and subsequently the step of FIG. 2-6 or later may be carried out. This can prevent loss of a shape of the organic substance 34-n which becomes the uppermost organic film 33-n when the sealing glass substrate 40 is placed. The thickness of the inorganic films 32-1 to 32-n and the thickness of the organic films 33-1 to 33-n may be the same in each of the inorganic/organic stacked bodies 31-1 to 31-n or may be different in each of the inorganic/organic stacked bodies 31-1 to 31-n.

In the aforementioned description, the top emission type organic EL device was described as the example, but the present invention may also be applied to the bottom emission type organic EL device in which the light generated in the organic EL element is extracted from the side of the substrate 10.

The organic EL device of the present invention may be used as, for example, a planar light source, a segment display device and a dot matrix display device.

This embodiment has the effect that the sealing structure having the sufficient barrier property against the water vapor and oxygen for the organic EL element 20 can be obtained since the sealing layer 30 is formed in order to block the ambient air from the organic EL element 20 formed on the substrate and the sealing glass substrate 40 is further disposed on the sealing layer 30. This embodiment also has the effect to obtain the sealing structure having a sufficient adhesive strength between the sealing glass substrate 40 and the sealing layer 30.

Furthermore, according to this embodiment, the following effects are obtained: the sealing layer 30 can be adhered to the sealing glass substrate 40 simultaneously with the formation of the uppermost organic film 33-n which constitutes the sealing layer 30 since the organic substance 34-n which constitutes the uppermost organic film 33-n in the sealing layer 30 is applied and then the sealing glass substrate 40 is placed thereon without curing the organic substance, and subsequently the organic substance 34-n is cured; as a result, the steps can be simplified compared with the case of allowing the sealing layer 30 and the sealing glass substrate 40 to adhere to each other with an adhesive.

EXAMPLES

The present invention will be described in more detail below with reference to Examples, but the present invention is not limited thereto.

The organic EL device depicted in FIG. 1 will be made by the following procedure.

First, an ITO film having a film thickness of about 150 nm is formed on a glass substrate as the substrate 10 using a sputtering method, and patterned into a predetermined shape using photolithography technology and etching technology to form an anode. Then, the glass substrate (10) on which the anode has been formed is washed with an organic solvent, an alkali detergent and ultrapure water, and dried, and subsequently a washing treatment with ultraviolet ray/ozone is given thereto by an ultraviolet ray/ozone-washing apparatus.

Then, a suspension of poly(3,4)ethylenedioxythiophene/polystyrene sulfonic acid (Baytron [registered trade name] P TP AI 4083 [brand name] supplied from HC Starck GmbH & Co., KG.) is filtrated through a filter having a pore diameter of 0.5 μm, and the filtrated suspension is formed into a film having a thickness of 70 nm by a spin coating method on the glass substrate (10) on which the anode has been formed. Subsequently, the glass substrate (10) is placed on a hotplate, and dried under atmospheric air at 200° C. for 10 minutes to form a hole injection layer.

Then, a solution of 1.5% by weight of a polymer organic light emitting material (Lumation GP1300 [brand name] supplied from Sumation Co., Ltd.) is made using a solvent in which xylene and anisole have been mixed at 1:1. This solution is formed into a film having the film thickness of 80 nm by the spin coating method on the glass substrate (10) on which the hole injection layer has been formed to form a light emitting layer. Subsequently, the light emitting layer at an extraction electrode portion and at a sealing area portion on the glass substrate (10) is removed, and the glass substrate (10) is introduced into a vacuum chamber and transferred to a heating room. The treatment is carried out in vacuum or a nitrogen atmosphere in the subsequent steps. Thus the organic EL device during the treatment is never exposed to the atmospheric air.

After transferring the glass substrate (10) to the heating room, the heating room in the vacuum chamber is heated under vacuum degree of $1\times10^{-4}$ Pa or less at about 100° C. for 60 minutes. Then, the glass substrate (10) is transferred to a deposition chamber, a cathode mask is aligned to the glass substrate, and the deposition is performed in the organic EL device so that a film of the cathode is formed at a light emitting section which is the region where the light is emitted and at an extraction electrode section. Here, the cathode has been formed with a Ba film obtained by heating a metal Ba and depositing Ba at a deposition speed of about 2 angstroms/second using a resistance heating method until the film thickness becomes 50 angstroms and an Al film obtained by depositing Al at a deposition speed of about 2 angstroms/second using an electron beam deposition method until the film thickness becomes 100 angstroms. Subsequently, the glass substrate (10) is transferred to a vacuum chamber having an opposed target mode sputtering apparatus, argon gas and oxygen gas are introduced into the vacuum chamber, and an ITO film having the film thickness of 1500 angstroms is formed by an opposed target mode sputtering method. In this way, the organic EL element 20 is formed on the glass substrate (10).

Subsequently, the glass substrate (10) on which the organic EL element 20 has been formed is transferred to a film sealing apparatus (Guardian 2 [product name] supplied from US VINTEX) without being exposed to the atmospheric air, and the mask is aligned and set to the glass substrate (10). Then, the glass substrate (10) is transferred to an inorganic film forming room, and an aluminium oxide film as the first inorganic film 32-1 is formed by the sputtering method. Here, the transparent and flat aluminium oxide film having the thickness of about 60 nm is formed on the glass substrate (10) by using an Al metal target having a purity of 5N and introducing argon gas and oxygen gas into the inorganic film forming room.

Then the mask is exchanged and the glass substrate (10) is transferred to an organic film forming room. Subsequently, an organic monomer material (Vitex Barix resin system monomer material [Vitex 70 (brand name) supplied from VINTEX) is introduced into a vaporizer, vaporized and a monomer vapor is sprayed out from a slit nozzle, and the glass substrate (10) is controlled to pass on the nozzle at a predetermined speed. Thus, the monomer having the uniform thickness is applied on the glass substrate (10). In the case of the substance to which the flash deposition can not be applied, the monomer film is formed on the glass substrate by the coating method such as the spin coating method. Subsequently, the glass substrate (10) to which the monomer has been applied is irradiated with the ultraviolet ray to crosslink and cure the monomer to form the first organic film 33-1. Thus, the first organic film 33-1 which is the transparent and flat film and has the film thickness of about 1.3 µm is obtained.

Then, the glass substrate (10) is transferred to the inorganic film forming room again, argon gas and oxygen gas are introduced into the inorganic film forming room, and the film of aluminium oxide which is the second inorganic film 32-2 is formed by the sputtering method. At that time, the transparent and flat aluminium oxide film having the thickness of about 40 nm is formed on the glass substrate (10).

Subsequently, the second organic film 33-2 is formed on the second inorganic film 32-2 in the same manner as in the first organic film 33-1, and the third inorganic film 32-3 is formed on the second organic film 33-2 in the same manner as in the second inorganic film 32-2.

Then, the monomer is applied on the third inorganic film 32-3 in the same manner as in the first organic film 33-1, subsequently without being irradiated with the ultraviolet ray and without being exposed to the atmospheric air, the glass substrate (10) is transferred from the organic film forming room to a glove box (sealing room) under an inert atmosphere (e.g., vacuum atmosphere). Here, the sealing glass substrate 40 previously prepared is put on the side to which the monomer has been applied on the glass substrate (10) on which the sealing layer 30 has been formed. This state is kept in vacuum, subsequently the glass substrate (10) is backed into the atmosphere at atmospheric pressure, and irradiated with the ultraviolet ray from the side of the sealing glass substrate 40 to crosslink the monomer and firmly fix with the sealing glass substrate 40. In this way, the organic EL device having the sealing structure of this embodiment is produced. The organic EL device produced as described above has a sufficient barrier property against water vapor and oxygen and a cohesive strength.

Industrial Applicability

As described above, the organic EL device and the method for producing the same according to the present invention are useful when the organic EL element is sealed from gas such as water vapor.

The invention claimed is:

1. A method for producing an organic electroluminescence device comprising the steps of:
   forming an organic electroluminescence element that holds an organic electroluminescence layer including a light emitting layer between one pair of electrodes of which at least one is transparent or translucent on a substrate;
   forming a transparent first inorganic film on the organic electroluminescence element;
   applying a polymerizable monomer on the first inorganic film;
   partially polymerizing the polymerizable monomer by energy ray or heat;
   putting a sealing glass substrate on the side where the polymerizable monomer has been partially polymerized; and
   curing the monomer by energy ray or heat to adhere the sealing glass substrate on the side where the monomer has been applied.

2. The method for producing the organic electroluminescence device according to claim 1 further comprising:
   forming a transparent first organic film by applying the polymerizable monomer on the first inorganic film and curing the monomer by the energy ray or the heat, after the step of forming the first inorganic film and before the step of applying the polymerizable monomer; and
   forming a transparent second inorganic film on said first organic film.

3. The method for producing the organic electroluminescence device according to claim 2, wherein the step of forming the first inorganic film and the step of forming the first organic film are repeated a certain number of times to form multiple layers of an inorganic/organic stacked body composed of the inorganic film and the organic film.

4. The method for producing the organic electroluminescence device according to claim 1, wherein the polymerizable monomer is a monomer of a (meth)acrylic compound.

* * * * *